(12) United States Patent  (10) Patent No.: US 8,558,259 B2
Wirth  (45) Date of Patent: Oct. 15, 2013

(54) OPTOELECTRONIC COMPONENT HAVING A DOME-LIKE CONVERSION ELEMENT

(75) Inventor: Ralph Wirth, Mintraching-Auhof (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 13/128,706

(22) PCT Filed: Nov. 2, 2009

(86) PCT No.: PCT/DE2009/001548
§ 371 (c)(1),
(2), (4) Date: Jun. 8, 2011

(87) PCT Pub. No.: WO2010/054622
PCT Pub. Date: May 20, 2010

(65) Prior Publication Data
US 2011/0272713 A1   Nov. 10, 2011

(30) Foreign Application Priority Data

Nov. 13, 2008   (DE) .................. 10 2008 057 140

(51) Int. Cl.
*H01L 33/00* (2010.01)
(52) U.S. Cl.
USPC ............. 257/95; 257/98; 257/99; 257/100; 257/E33.068; 257/E33.073
(58) Field of Classification Search
USPC ......... 257/95, 98, 99, 100, E33.068, E33.073
See application file for complete search history.

(56) References Cited

U.S. PATENT DOCUMENTS

| 5,836,676 | A  | * | 11/1998 | Ando et al. ................... 362/244 |
| 6,577,073 | B2 | * | 6/2003  | Shimizu et al. ............... 315/246 |
| 6,635,987 | B1 | * | 10/2003 | Wojnarowski et al. ........ 313/498 |
| 6,639,360 | B2 | * | 10/2003 | Roberts et al. ................ 313/512 |
| 7,554,258 | B2 |   | 6/2009  | Rossner et al. ................ 313/503 |
| 7,586,127 | B2 | * | 9/2009  | Nomura et al. ................. 257/89 |
| 7,736,027 | B2 | * | 6/2010  | Ge ................................. 362/294 |
| 7,777,412 | B2 | * | 8/2010  | Pang ............................. 313/506 |
| 7,800,121 | B2 | * | 9/2010  | Aanegola et al. .............. 257/98 |
| 7,842,960 | B2 | * | 11/2010 | Reginelli et al. ............... 257/98 |
| 7,872,279 | B2 | * | 1/2011  | Lin et al. ........................ 257/99 |
| 7,893,452 | B2 | * | 2/2011  | Harle .............................. 257/99 |
| 8,039,850 | B2 | * | 10/2011 | Lee et al. ........................ 257/88 |
| 8,120,247 | B2 | * | 2/2012  | Schmidt et al. ............... 313/506 |
| 8,465,175 | B2 | * | 6/2013  | Nall et al. ................ 362/249.06 |
| 2004/0222735 | A1 | * | 11/2004 | Ragle ............................ 313/501 |
| 2005/0093430 | A1 |   | 5/2005  | Ibbetson et al. .............. 313/501 |
| 2006/0081862 | A1 | * | 4/2006  | Chua et al. ....................... 257/98 |

(Continued)

FOREIGN PATENT DOCUMENTS

CN       1949507 A       4/2007
DE    103 49 038 A1     5/2004

(Continued)

*Primary Examiner* — Ida M Soward
(74) *Attorney, Agent, or Firm* — DLA Piper LLP (US)

(57) ABSTRACT

An optoelectronic component includes a connection carrier on which at least two radiation-emitting semiconductor chips are arranged, a conversion element fixed to the connection carrier, wherein the conversion element spans the semiconductor chips such that the semiconductor chips are surrounded by the conversion element and the connection carrier, and at least two of the radiation-emitting semiconductor chips differ from one another with regard to wavelengths of electromagnetic radiation they emit during operation, wherein the conversion element spans the semiconductor chips as a dome.

22 Claims, 7 Drawing Sheets

(56) References Cited

U.S. PATENT DOCUMENTS

| | | |
|---|---|---|
| 2007/0108455 A1* | 5/2007 | Sun et al. ............... 257/89 |
| 2007/0241661 A1 | 10/2007 | Yin .................... 313/502 |
| 2007/0281851 A1 | 12/2007 | Seneschal-Merz et al. ..... 501/10 |
| 2008/0048200 A1 | 2/2008 | Mueller et al. ............ 257/98 |
| 2008/0054280 A1 | 3/2008 | Reginelli et al. .......... 257/98 |
| 2008/0074032 A1* | 3/2008 | Yano et al. ............. 313/503 |
| 2008/0123021 A1* | 5/2008 | Park et al. ............... 349/67 |
| 2008/0144322 A1* | 6/2008 | Norfidathul et al. ....... 362/310 |
| 2008/0145960 A1* | 6/2008 | Kolodin et al. ............ 438/28 |
| 2008/0203414 A1* | 8/2008 | Yen et al. ................ 257/98 |
| 2008/0231214 A1* | 9/2008 | Kim et al. ............... 315/360 |
| 2009/0040755 A1 | 2/2009 | Kopp et al. .............. 362/231 |
| 2009/0046456 A1* | 2/2009 | Urano et al. ............. 362/235 |
| 2009/0050910 A1* | 2/2009 | Sun ....................... 257/89 |
| 2009/0134408 A1* | 5/2009 | Park et al. ............... 257/88 |
| 2009/0283779 A1* | 11/2009 | Negley et al. ............ 257/88 |
| 2010/0127283 A1* | 5/2010 | van de Ven et al. ........ 257/89 |
| 2010/0207134 A1* | 8/2010 | Tanaka et al. ............. 257/89 |
| 2010/0207135 A1* | 8/2010 | Aketa et al. .............. 257/93 |
| 2010/0244740 A1* | 9/2010 | Alpert et al. ............ 315/297 |
| 2010/0308356 A1* | 12/2010 | Wirth .................... 257/98 |
| 2011/0006317 A1* | 1/2011 | McMillan ................. 257/89 |
| 2011/0102883 A1* | 5/2011 | Narendran et al. ......... 359/326 |
| 2012/0140435 A1* | 6/2012 | Li et al. ................. 362/84 |

FOREIGN PATENT DOCUMENTS

| | | |
|---|---|---|
| DE | 10 2007 049 799 A1 | 4/2009 |
| DE | 10 2008 045 331 A1 | 3/2010 |
| FR | 2 896 944 A1 | 8/2007 |
| JP | 2007-80872 A | 3/2007 |
| WO | 01/41215 A1 | 6/2001 |
| WO | 2007/088267 A2 | 8/2007 |
| WO | 2007/148253 A1 | 12/2007 |
| WO | 2008/056300 A1 | 5/2008 |
| WO | 2010/022699 A1 | 3/2010 |

\* cited by examiner

OPTOELECTRONIC COMPONENT HAVING A DOME-LIKE CONVERSION ELEMENT

RELATED APPLICATIONS

This is a §371 of International Application No. PCT/DE2009/001548, with an international filing date of Nov. 2, 2009 (WO 2010/054622, published May 20, 2010), which is based on German Patent Application No. 10 2008 057 140.7, filed Nov. 13, 2008, the subject matter of which is incorporated by reference.

TECHNICAL FIELD

This disclosure relates to optoelectronic components, particularly to an optoelectronic component which emits light having a particularly high color rendering index during operation.

SUMMARY

I provide an optoelectronic component including a connection carrier on which at least two radiation-emitting semiconductor chips are arranged, a conversion element fixed to the connection carrier, wherein the conversion element spans the semiconductor chips such that the semiconductor chips are surrounded by the conversion element and the connection carrier, and at least two of the radiation-emitting semiconductor chips differ from one another with regard to wavelengths of electromagnetic radiation they emit during operation, wherein the conversion element spans the semiconductor chips as a dome.

DETAILED DESCRIPTION

My optoelectronic component may comprise a connection carrier, on which at least two radiation-emitting semiconductor chips are arranged.

The connection carrier is a printed circuit board, for example, on which or in which are arranged electrical conductor tracks and electrical connection locations which serve for making electrical contact with and mechanically fixing the radiation-emitting semiconductor chips. The connection carrier can be substantially planar in the manner of a plate. That is to say that in this case the connection carrier has no cavity in which a radiation-emitting semiconductor chip is arranged. Furthermore, it is possible for the connection carrier to be a leadframe, on which the radiation-emitting semiconductor chips can be arranged. In particular, in this case, it is also possible for the connection carrier to have at least one cavity for receiving the radiation-emission semiconductor chips.

The radiation-emitting semiconductor chips are preferably luminescence diode chips, that is to say light-emitting diode chips or laser diode chips. The radiation-emitting semiconductor chips are preferably suitable for generating electromagnetic radiation in the UV or visible spectral range.

The component may comprise a conversion element. The conversion element is a component part of the optoelectronic component which contains a luminescence conversion substance or is formed from a luminescence conversion substance.

If, for example, electromagnetic radiation generated by at least one of the radiation-emitting semiconductor chips during operation impinges on the conversion element, then the electromagnetic radiation can be completely or partly absorbed by the luminescence conversion substance of the conversion element. The luminescence conversion substance then reemits electromagnetic radiation comprising other, preferably higher, wavelengths than the electromagnetic radiation emitted by the at least one radiation-emitting semiconductor chip during operation. By way of example, during passage through the conversion element, part of the electromagnetic radiation from the blue spectral range generated by at least one of the radiation-emitting semiconductor chips during operation is converted into electromagnetic radiation from the yellow spectral range.

The conversion element may span the radiation-emitting semiconductor chips such that all the radiation-emitting semiconductor chips are surrounded by the conversion element and the connection carrier. That is to say that the conversion element is stretched above the at least two radiation-emitting semiconductor chips, for example, in the manner of a dome. In other words, the radiation-emitting semiconductor chips are then arranged between the connection carrier and the conversion element. The conversion element forms, for example, a cavity above the semiconductor chips. The radiation-emitting semiconductor chips are fixed by their mounting surfaces on the connection carrier, for example. At the side surfaces of the radiation-emitting semiconductor chips and at the radiation exit surfaces of the semiconductor chips facing away from the mounting surfaces, the semiconductor chips are surrounded by the conversion element. In this case, the conversion element preferably does not directly adjoin the semiconductor chips, rather the semiconductor chips and the conversion element do not touch one another. That is to say that at least the radiation exit surfaces of the semiconductor chips are preferably at a distance from the conversion element and are not in direct contact with the latter.

The conversion element can comprise a matrix material, for example, into which a luminescence conversion substance is introduced.

The conversion element is preferably mechanically self-supporting. The conversion element can be, for example, a self-supporting dome or shell that spans the radiation-emitting semiconductor chips.

The conversion element may be fixed to the connection carrier. That is to say that the conversion element has a mechanically fixed connection to the connection carrier. By way of example, the conversion element can be connected to the connection carrier by means of a connecting means, for example, a thin adhesive layer. Furthermore, it is possible for the conversion element, for example, to be bonded to the connection carrier or to be connected to the connection carrier by a press fit.

At least two of the radiation-emitting semiconductor chips of the component may differ with regard to the wavelengths of the electromagnetic radiation emitted by them during operation. In other words, at least two of the radiation-emitting semiconductor chips emit, for example, light of different colors. In this case, it is possible for at least one of the radiation-emitting semiconductor chips to emit electromagnetic radiation in a wavelength range which is not or is hardly converted by the conversion element. This electromagnetic radiation is then principally scattered and transmitted by the conversion element, which can result in particularly good mixing with the electromagnetic radiation reemitted by other radiation-emitting semiconductor chips of the optoelectronic component and the electromagnetic radiation reemitted by the conversion element.

The component may comprise a connection carrier, on which at least two radiation-emitting semiconductor chips are arranged. Furthermore, the component may comprise a conversion element fixed to the connection carrier, wherein the conversion element spans the semiconductor chips in such a way that the semiconductor chips are surrounded by the conversion element and the connection carrier. At least two of the radiation-emitting semiconductor chips of the component differ from one another with regard to the wavelength of the electromagnetic radiation emitted by them during operation.

The term "semiconductor chip" should also be understood to mean a semiconductor chip having a semiconductor body on the radiation exit surface of which is applied a further conversion element. That is to say that the semiconductor chip then comprises a semiconductor body, in which electromagnetic radiation is generated during operation, and also a further conversion element, which can be situated in direct contact with the semiconductor body and is disposed downstream of the latter at a radiation exit surface. The semiconductor chip then emits mixed radiation composed of primarily generated radiation and converted radiation.

The conversion element may consist of one of the following materials: a ceramic material, a glass ceramic material. That is to say that the conversion element is not formed by a luminescence conversion substance dissolved into a matrix material such as silicone or epoxy resin, for example, rather the conversion element is formed with a ceramic material or a glass ceramic material. In this case, it is possible for the luminescence conversion substance of the conversion element itself to be a ceramic material and the conversion element to consist completely of the ceramic luminescence conversion substance. Furthermore, it is possible for at least one ceramic luminescence conversion substance to be introduced into a ceramic material or into a glass ceramic material as matrix material and for the conversion element to be formed in this way.

Suitable ceramics for forming such a conversion element are explained in greater detail inter alia in WO 2007/148253, the disclosure and contents of which are hereby incorporated by reference. Suitable glass ceramic materials for forming a conversion element are described, for example, in US 2007/0281851, the disclosure and contents of which are hereby incorporated by reference.

In this case, the optoelectronic component described here makes use, inter alia, of the following insights and is based on the following advantages: a glass ceramic material or a luminescent ceramic for forming the conversion element is distinguished by a thermal conductivity that is significantly higher than, for example, the thermal conductivity of silicone. Preferably, the conversion element has a thermal conductivity of ≥1.0 W/mK.

On account of the fixing of the conversion element to the connection carrier, the conversion element is furthermore thermally conductively connected to the connection carrier and thus, for example, to a heat sink on which the connection carrier can be applied. Heat generated during the conversion of radiation passing through in the conversion element can be dissipated particularly well in this way.

By way of example, the conversion element consists of a YAG:Ce ceramic. Such a conversion element is then distinguished by a thermal conductivity of approximately 14 W/mK.

Furthermore, a conversion element composed of a glass ceramic material or a ceramic material forms a mechanically stable protection of the semiconductor chips spanned by the conversion element against external influences. Additional housing of the semiconductor chips can therefore be dispensed with.

Furthermore, the use of radiation-emitting semiconductor chips having different emission wavebands proves to be advantageous for generating white mixed light of the optoelectronic component which has a particularly high color rendering index. Although electromagnetic radiation is at least partly absorbed by the conversion element in wavelength ranges which are not or are hardly converted by the conversion element, this disadvantage in the efficiency is compensated for, for example, by particularly good light mixing by scattering of the electromagnetic radiation at the conversion element.

The optoelectronic component may comprise at least one radiation-emitting semiconductor chip which, during operation, emits electromagnetic radiation from a wavelength range which is not or is hardly converted by the conversion element. By way of example, the semiconductor chip emits red or green light. Furthermore, it is possible for the component to comprise a plurality of such semiconductor chips, for example, a semiconductor which emits red light and a semiconductor chip which emits green light. The optoelectronic component then additionally comprises at least one radiation-emitting semiconductor chip whose electromagnetic radiation emitted during operation is at least partly converted by the conversion element. By way of example, this semiconductor chip is a semiconductor chip which emits blue light, wherein the blue light is converted by the conversion element partly to form yellow light and mixes with this yellow light to form white light.

The light from a radiation-emitting semiconductor chip emitting red is partly absorbed by the conversion element. By way of example, an absorption of least 10% arises. It has now been found that this purported disadvantage of absorption is more than compensated for by particularly good mixing of the red light with electromagnetic radiation emitted by semiconductor chips of a different color and the electromagnetic radiation emitted by the conversion element. That is to say that, by scattering at the dome-like conversion element, the red light is admixed almost ideally with the white light generated in the dome. The same also applies to the light from different-colored semiconductor chips which is not wavelength-converted by the conversion element. Therefore, light mixing efficiencies of at least 90% can be achieved with the component described. Such high efficiencies cannot be realized with alternative solutions for light mixing such as light boxes and microlens arrays. Furthermore, such alternative possibilities for light mixing, in comparison with the optoelectronic component described, are comparatively expensive and occupy a larger space, that is to say are larger. In the case of the present optoelectronic component, furthermore, a secondary optical unit disposed downstream of the conversion element in the emission direction can be in a particularly small fashion and thus cost-effectively. By way of example, a simple, for example, parabolically configured, reflector is used as secondary optical unit. More complicated optical elements such as light boxes or microlens arrays can be obviated.

At least one of the radiation-emitting semiconductor chips may emit white light during operation. By way of example, this semiconductor chip is a semiconductor chip which comprises a semiconductor body, downstream of which is disposed, at a radiation exit surface, a further conversion element, which converts at least part of the electromagnetic radiation generated in the semiconductor body during operation into electromagnetic radiation from the spectral range of yellow light. The further conversion element is, for example, a chip-level conversion element, wherein the conversion substance—for example, introduced into a matrix material composed of silicone—is applied directly to the radiation exit surface of the semiconductor body. In this case, the conversion substance of the further conversion element can be identical to a conversion substance of the dome-like conversion element or be different therefrom. That is to say that what is proposed here—contrary to intuition—is for the, for example, blue electromagnetic radiation generated in a semiconductor body to be converted twice as it were by the further conversion element and the dome-like conversion element. That is to say that light emitted by the semiconductor chip which emits white light is converted twice, such that conversion from blue light into yellow light substantially takes place.

The yellow light can serve to form a warm-white light source in a particularly simple manner.

In this case, it is also possible for the dome-like conversion element and the further conversion element to comprise different luminescence conversion substances. Thus, the dome-like conversion element can comprise, for example, conversion substances which are particularly temperature-sensitive, since this conversion element is thermally connected particularly well to the connection carrier. For the further conversion element it is possible to use other luminescence conversion substances, which are particularly well suited to conversion near the chip.

An optical sensor is fixed on the connection carrier, the optical sensor being spanned by the conversion element in such a way that the optical sensor is surrounded by the conversion element and the connection carrier. That is to say that, just like the radiation-emitting semiconductor chips, the optical sensor is arranged below the dome formed by the conversion element. The optical sensor is a photodiode, for example. The optical sensor detects, for example, scattered light scattered back from the conversion element into the interior of the region spanned by the conversion element. The different spectral parts of the light generated by the radiation-emitting semiconductor chips and the conversion element can be detected by the sensor. By way of example, by means of a driving device, which can likewise be fixed on the connection carrier, the radiation-emitting semiconductor chips can then be regulated in such a way that a desired color temperature and/or a desired color locus of the light emitted by the optoelectronic component are/is established. By way of example, the CX and CY coordinates of the emitted light of the component can be set to a desired white point by the driving device. This reduces the complexity in the so-called "binning" of the radiation-emitting semiconductor chips.

In this case, the optical sensor can be wavelength-selective. The optical sensor then comprises a plurality of facets having different spectral sensitivities. Alternatively, it is possible for the radiation-emitting semiconductor chips to be operated in pulsed fashion and for the optical sensor to be a sensor having just a single facet. In this case, for a short time interval, each radiation-emitting semiconductor chip individually or only the radiation-emitting semiconductor chips of the same color is or are operated, such that only electromagnetic radiation of this semiconductor chip or semiconductor chips of this color can be detected by the sensor.

The driving device for driving the radiation-emitting semiconductor chips can be a microcontroller, for example, which can be arranged on or outside the connection carrier.

At least one intermediate region may be arranged between the semiconductor chips and the conversion element, the at least one intermediate region being filled with a gas. That is to say that the space between the semiconductor chips and the conversion element can be filled with a gas at least in places. By way of example, the gas can be air. The semiconductor chips are therefore not in direct contact with the conversion element.

The radiation-emitting semiconductor chips and—if present—the optical sensor may be embedded in a common molded body. That is to say that the semiconductor chips are enveloped by a molded body in a positively locking manner at least in places at their uncovered outer surfaces, the molded body being in direct contact with the semiconductor chips at least in places. In this case, the molded body can be a potting, for example. The molded body is as far as possible completely transmissive to the electromagnetic radiation generated by the radiation-emitting semiconductor chips during operation. That is to say that the molded body consists of a material which absorbs hardly any or no electromagnetic radiation of the radiation-emitting semiconductor chips at all.

By way of example, the molded body is formed from a silicone, an epoxide, or from a silicone-epoxide hybrid material. The molded body encloses the semiconductor chips in a positively locking manner at the free outer surfaces thereof and can have a spherically curved outer surface, for example.

The molded body is preferably free of a light-scattering or radiation-absorbing material such as, for example, a luminescence conversion material. That is to say that the molded body comprises no luminescence conversion substance or diffuser particles apart from extremely small impurities. The molded body is therefore preferably in transparent fashion.

The intermediate region filled with a gas may extend between the molded body and the conversion element, wherein the intermediate region directly adjoins the molded body. That is to say that the molded body has an outer surface which faces away from the semiconductor chips and at which the molded body adjoins the intermediate region. In this case, the intermediate region can extend as far as the connection carrier. In this case, the intermediate region can be in a dome-like manner. At its inner surface facing the molded body, it follows the form of the outer surface of the molded body. At its outer surface facing the conversion element, it can follow the course of the inner surface of the conversion element.

In this case, the intermediate region makes use of the following insight, inter alia: during the operation of the optoelectronic component, as a result of the heating of the radiation-emitting semiconductor chips, the molded body in which the semiconductor chips are embedded is also subjected to heating. This heating, particularly if the molded body contains a silicone, can lead to the thermal expansion of the molded body. The intermediate region is dimensioned, then, in such a way that the molded body does not come into contact with the conversion element despite the thermal expansion. That is to say that the conversion element and the molded body, preferably, including during the operation of the optoelectronic component, are always separated from one another by the intermediate region, such that molded body and conversion element are not in direct contact with one another. This prevents, inter alia, a situation in which, on account of the expanding molded body in the case of a temperature increase, a lift-off of the conversion element can arise on account of the pressure of the molded body on the conversion element.

The optoelectronic component may comprise a coupling-out lens which adjoins the outer surface of the conversion element, the outer surface facing away from the semiconductor chip. The coupling-out surface can be in direct contact with the outer surface of the conversion element. In this case, the coupling-out lens can constitute a separately produced element of the optoelectronic component which, for example, is milled, turned or injection-molded and fixed above the conversion element in a mounting step. Furthermore, it is also possible, however, for the coupling-out lens to be produced on the further component parts of the optoelectronic component and to be applied, for example, directly as a potting onto the conversion element.

The coupling-out lens is at least substantially transmissive to the electromagnetic radiation emitted by the optoelectronic component and/or by the conversion element. In particular, the coupling-out lens is preferably free of a luminescence conversion substance. That is to say that the coupling-out lens comprises no luminescence conversion substance apart from extremely small impurities.

The coupling-out lens may have an inner surface, which faces the semiconductor chip and which is enclosed by an inner hemispherical surface having the radius $R_{conversion}$. Furthermore, the coupling-out lens has an outer surface, which faces away from the semiconductor chips and which encloses an outer hemispherical surface having the radius $R_{outer}$. In this case, the two radii meet the following condition: $R_{outer} \geq R_{conversion} \times n_{lens}/n_{air}$. In this case, $n_{lens}$ and $n_{air}$ are the refractive indexes of the coupling-out lens and, respectively, of the surroundings of the coupling-out lens, typically of air.

The inner and outer hemispherical surfaces can be purely virtual surfaces that are not necessarily or do not necessarily occur as substantive features in the component. In particular, the coupling-out lens meets the abovementioned condition, also known as "Weierstrass" condition, if the hemispherical shell formed by inner and outer hemispherical surfaces having the radii lies in its entirety within the coupling-out lens.

In particular, it is also possible for the coupling-out lens to be a spherical shell whose inner radius is $R_{conversion}$ and whose outer radius is $R_{outer}$. In this case, in a manner governed by production, the form of the coupling-out lens can deviate slightly from the mathematically exact spherical form for inner and outer surfaces.

In other words: if the coupling-out lens meets the abovementioned condition, then the coupling-out lens is shaped and spaced apart from the semiconductor chips in such a way that the outer surface of the coupling-out lens, as seen from every point of the semiconductor chips, appears at such a small angle that no total reflection occurs at the outer side of the coupling-out lens. A coupling-out lens that obeys this condition therefore has only very low radiation losses on account of total reflection at its outer surface. The coupling-out efficiency of the opto-electronic component is thus advantageously increased.

The molded body in which the optoelectronic semiconductor chips are embedded may be enclosed by a hemispherical surface having the radius $R_{inner}$. In this case, the semiconductor chips have a total radiation exit surface having the area content A. In this case, the total radiation exit surface is composed of the sum of the radiation exit surfaces of the semiconductor chips.

In this case, the area content A and the radius $R_{inner}$ meet the condition $A \leq \frac{1}{2} \times \pi \times R_{inner}^2$. Preferably, the area content A is in this case $\geq \frac{1}{20} \times \pi \times R_{inner}^2$. In this case, it is assumed that a single molded body envelops all the radiation-emitting semiconductor chips of the optoelectronic component. Such a small area content of the total radiation exit surface of the radiation-emitting semiconductor chips ensures that, for example, electromagnetic radiation reflected back or emitted from the conversion element to the semiconductor chips impinges with low probability on the semiconductor chips, where it might be lost by absorption, for example.

By way of example, in this case, a reflective layer is arranged on that side of the connection carrier which faces the molded body, the reflective layer directly adjoining the molded body at least in places and having a reflectivity of at least 80%, preferably of at least 90%, both for electromagnetic radiation generated by the semiconductor chips and for electromagnetic radiation generated by the conversion element. Particularly preferably, the reflective layer has a reflectivity of at least 98%. In this case, the reflective layer is preferably situated within the hemisphere having the radius $R_{inner}$. In this way, radiation impinges with high probability on the reflective layer and not on the radiation exit surfaces of the radiation-emitting semiconductor chips.

A connecting means, for example, an adhesive or a solder material, may be arranged between the conversion element and the connection carrier. The connecting means can directly adjoin the conversion element and the connection carrier. In this case, the connecting means, in particular the adhesive, is preferably applied in a thin layer having a thickness of at most 10 µm, preferably at most 6 µm. Such a thin layer ensures that heat generated by the conversion element can be emitted to the connection carrier particularly efficiently.

The conversion element may contain a luminescence conversion substance or consists of a luminescence conversion substance which is based on one of the following materials: orthosilicate, thiogallates, sulfide, nitride, fluoride, garnet.

The conversion element may be formed with a luminescence conversion substance which is activated by at least one dopant selected from the group consisting of Eu3+, Mn2+ and Mn4+.

In this case, the optoelectronic component described here is based on the following insight, inter alia: as a result of the relatively large distance between semiconductor chips and conversion element in the optoelectronic component described here, the electromagnetic radiation generated by the semiconductor chips during operation is distributed over a relatively large area and over a relatively large volume. The use of slowly decaying phosphors is possible as a result. In this case, slowly decaying phosphors are understood to be phosphors which a have a decay time of >1 µs. These include luminescence conversion materials activated with Eu3+, Mn2+ and Mn4+, for example. As a result of the relatively large distance between the semiconductor chips and conversion element, a saturation effect becomes unlikely even in the case of the slowly decaying phosphors. For faster phosphors such as YAG:Ce, for example, which have a shorter decay time, saturation effects are even completely avoided in this optoelectronic component.

Furthermore, on account of the distribution of the electromagnetic radiation over a larger area and over a larger volume, it is possible to use luminescence conversion materials having an increased sensitivity to radiation damage, for example, as a result of UV radiation. Nitrides such as, e.g., $Sr_2Si_5N_8$:Eu and also sulfides, oxynitrides and fluids can be mentioned here by way of example. These luminescence conversion materials can be used in the opto-electronic component as described here.

On account of the fact that the conversion element in at least one example of the optoelectronic component consists of a ceramic or a glass ceramic, the effective surface area of the phosphor is extremely reduced on account of the sintering of the luminescence conversion substances. As a result, however, slow chemical reactions with moisture, $CO_2$, oxygen or other atmospheric gases are largely prevented since a reduced reaction surface area is available. This concerns, in particular, luminescence conversion substances such as sulfides, orthosilicates or nitrides. On account of the use of a conversion element consisting of ceramic or a glass ceramic, the lifetime of the conversion element and thus of the entire optoelectronic component is thus also increased.

On account of the fact that slowly decaying luminescence conversion materials such as narrowband f-f line emitters (for example, Eu3+, Mn4+) can be used in conjunction with semiconductor chips that emit UV radiation, it is possible to achieve high color rendering values and efficiency values of the optoelectronic component. The disadvantage of early onset saturation effects does not occur in this case.

Furthermore, in the component described here, it is possible to use luminescence conversion substances having low activator concentrations, with concentrations of up to 1/100 of what is customary in conventional luminescence conversion substances. That is to say that the component described here also enables the use of luminescence conversion substances which otherwise cannot be used on account of their poor thermal behavior, their sensitivity to atmospheric gases or their slow decay time. These include, for example, blue-green to red-orange emitting orthosilicates, thiogallates, sulfides, nitride, fluoride and/or narrowband f-f line emitters.

The optoelectronic component described here is explained in greater detail below on the basis of examples and associated figures.

In the figures, elements that are identical, of identical type or act identically are provided with the same reference symbols. The figures and the size relationships of the elements illustrated in the figures among one another should not be regarded as true to scale. Rather, individual elements may be illustrated with exaggerated size to enable better illustration and/or to afford a better understanding.

Figure 1A:
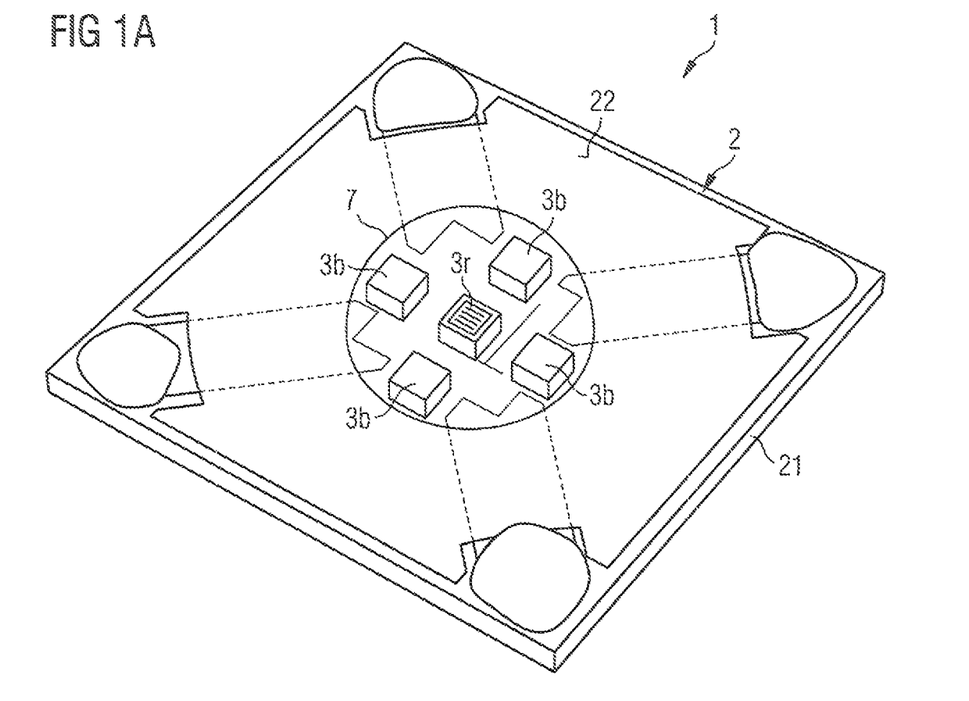
FIGS. 1, 2 and 3 show, on the basis of schematic illustrations, different examples of an optoelectronic component.

FIG. 1A shows a schematic perspective illustration of a first example of a component 1 described here. The component 1 comprises a connection carrier 2. In this case, the connection carrier 2 is a metal-core circuit board having a base body 21, to which a reflective layer 22 is applied, which is reflective for electromagnetic radiation generated by the radiation-emitting semiconductor chips 3 during operation. By way of example, the reflective layer 22 consists of aluminum or silver.

In this case, five radiation-emitting semiconductor chips 3 are arranged onto the connection carrier 2. In this case, the optoelectronic component comprises four radiation-emitting semiconductor chips 3b which emit blue light and one semiconductor chip 3r which emits red light.

The radiation-emitting semiconductor chips 3b which emit blue light are based on the InGaN semiconductor material system, for example. The semiconductor chip 3r which emits red light is based on the InGaAlP semiconductor material system.

The radiation-emitting semiconductor chips 3 are enveloped by a molded body 7 in a positively locking manner, the molded body consisting of a transparent silicone in this case.

During the operation of the radiation-emitting semiconductor chips, blue and red light is emitted by the semiconductor chips. For reasons of clarity, the optoelectronic component 1 is illustrated without the converter element 4 in FIG. 1A.

Figure 1B:
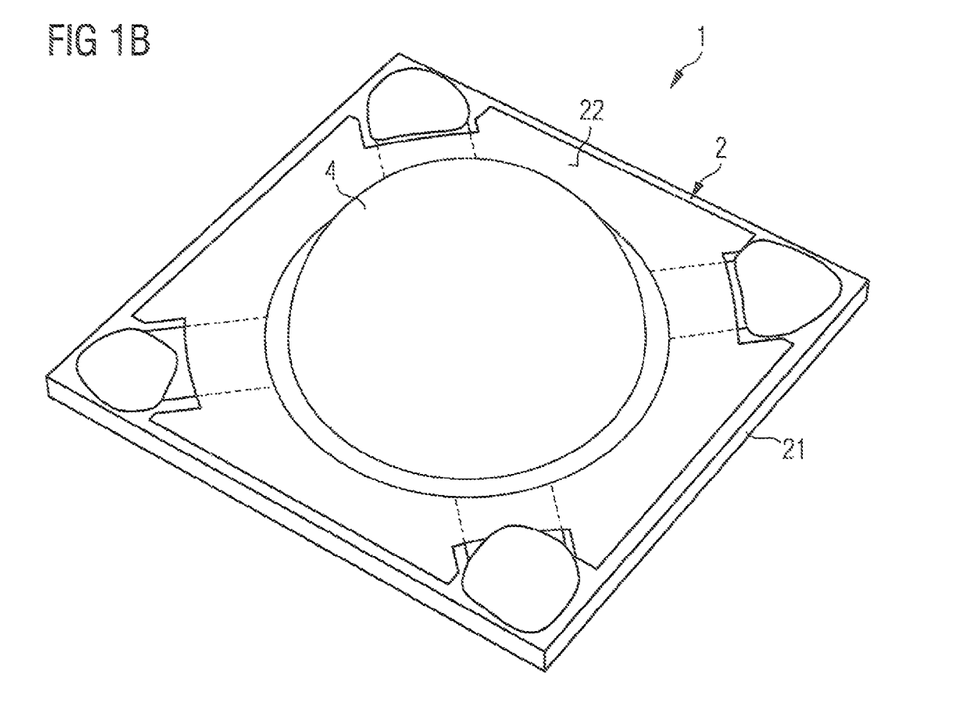

In conjunction with the schematic perspective illustration in FIG. 1B, the optoelectronic component of the example in FIG. 1A is illustrated with the converter element 4. The converter element 4 is fixed on the connection carrier 2—for example, by means of an adhesive. The converter element 4 spans the molded body 7 and the radiation-emitting semiconductor chips 3 in the manner of a dome. The converter element 4 consists of a ceramic material or a glass ceramic material.

By way of example, the converter element 4 consists of a ceramic luminescence conversion substance.

The converter element 4 partly absorbs the electromagnetic radiation generated by the blue semiconductor chips 3b and converts it into electromagnetic radiation from the spectral range of yellow light. In this way, the conversion element 4 emits white mixed light composed of the blue non-converted light and the yellow converted light.

Furthermore, by means of the conversion element 4, the red light of the radiation-emitting semiconductor chip 3r is admixed particularly uniformly with the white light generated.

The conversion element 4 therefore serves—alongside its properties as a converter—also as a light-scattering optical element with which particularly good color mixing is achieved.

Overall, the optoelectronic semiconductor component therefore emits white light having a red proportion, wherein the red proportion is only a fraction of the total radiation. Although the converter transmits approximately only 85% of the red light, the efficiency of the optoelectronic component decreases to only approximately 96% since the red proportion constitutes a relatively small proportion of the white mixed light generated.

Figure 2A:
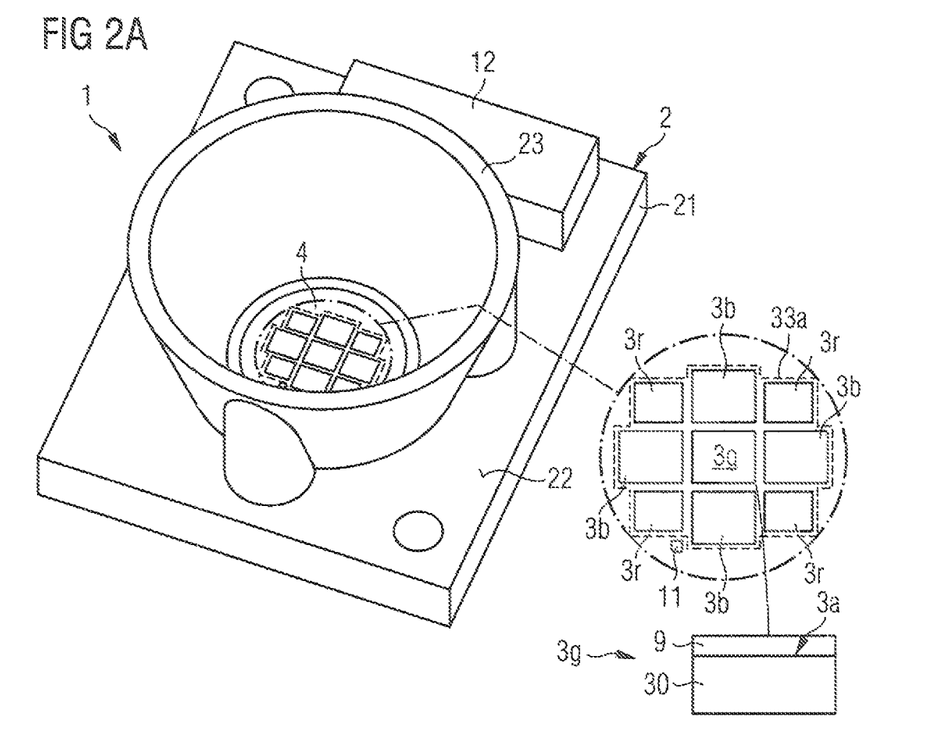
Figure 2B:
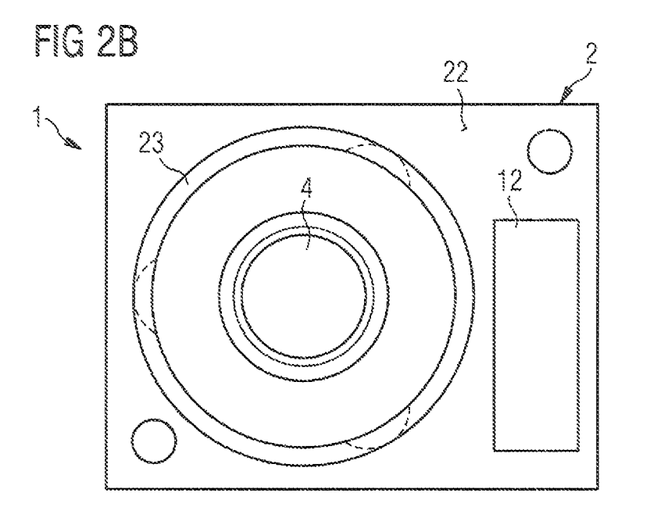
Figure 2C:
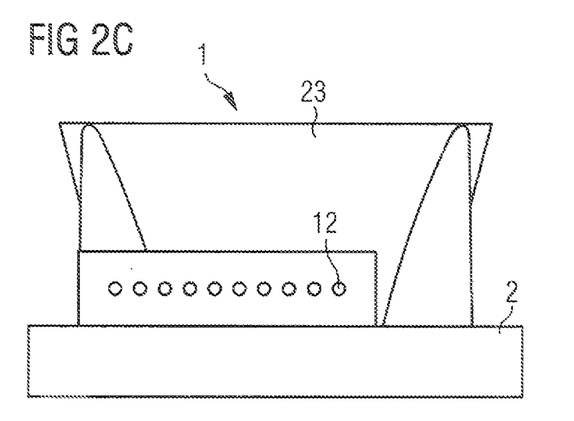

In conjunction with FIGS. 2A to 2C, a further example of an optoelectronic component 1 described here is explained in greater detail on the basis of schematic illustrations. In contrast to the example explained in conjunction with FIGS. 1A and 1B, the optoelectronic component in this example comprises, alongside red emitting semiconductor chips 3r and blue emitting semiconductor chips 3b, at least one semiconductor chip 3g which emits white light. The semiconductor chip 3g which emits white light comprises a semiconductor body 30, which emits blue light, for example, during operation. A further conversion element 9 is applied—for example, in a thin layer—to a radiation exit surface 3a of the semiconductor body 30. The conversion element 9 converts part of the radiation generated in the semiconductor body chip 30 into yellow light, such that the semiconductor chip 3g which emits white light emits white mixed light overall. The semiconductor chip 3g which emits white mixed light is therefore a semiconductor chip in which a conversion element 9 is applied directly on the semiconductor body 30. The dome-like conversion element 4 converts the blue proportion of the white light at least partly further into yellow light, such that the light generated by the semiconductor chip 3g which emits white light leaves the optoelectronic component overall as for the most part yellow or yellowish light.

By way of example, with the combination of a blue emitting semiconductor chip 3b, a red emitting semiconductor chip 3r and a white emitting semiconductor chip 3g, it is possible to set all color loci along the Planck curve for correlated color temperatures of between 2700 K and 6000 K.

By way of example, the following light sources can be realized:

An optoelectronic component having a total radiation exit surface area of the blue semiconductor chips of 4 mm$^2$, having a total radiation exit surface area of the red semiconductor chips of 2 mm$^2$ and optionally having a total radiation exit surface area of the white semiconductor chips of 1 mm$^2$; a warm-white light source having a color temperature of approximately 3000 K and a color rendering index CRI>90 is realized as a result. The optional white semiconductor chip is operated at average currents and serves together with driving electronics to set the color coordinates Cx, Cy exactly to the desired white point. The binning problem is thereby eliminated.

In this case, it should be taken into consideration that the efficiency of the semiconductor chip decreases with the current density. If, by way of example, the blue emitting semiconductor chips 3b are operated in a constant fashion with current densities of 350 mA, then the white semiconductor chip is operated at an average current intensity of 175 mA, the current intensity for setting the white point being variable between 0 and 350 mA.

An optoelectronic component having a total radiation exit surface area of the blue semiconductor chips of 5 mm$^2$, having a total radiation exit surface area of the red semiconductor chips of 1 mm$^2$ and optionally having a total radiation exit surface area of the white semiconductor chips of 1 mm$^2$; a cold-white light source having a color temperature of approximately 6000 K and a color rendering index CRI>90 and an efficiency of >100 lm/W is realized as a result. Such cold-white light sources usually have a color rendering index of CRI<70 given this efficiency.

An optoelectronic component having a total radiation exit surface area of the blue semiconductor chips of 2 mm$^2$, having a total radiation exit surface area of the red semiconductor chips of 2 mm$^2$ and having a total radiation exit surface area of the white semiconductor chips of 3 mm$^2$; an adjustable light source having a color temperature of between 6000 K and 2700 K, which is tunable on the Planck curve, and a color rendering index CRI>90 and an efficiency of >90 lm/W for all color temperatures is realized as a result.

Light mixing of the electromagnetic radiation generated by the different-colored semiconductor chips 3r, 3b, 3g and of the electromagnetic radiation reemitted by the conversion element 4 is once again effected by the conversion element 4. Large optical elements such as light boxes or microlens arrays can be dispensed with in this way. As a secondary optical unit, a reflector 23 more simply, having, for example, parabolically shaped inner walls, can therefore be disposed downstream of the optoelectronic semiconductor chips and the conversion element 4.

The optoelectronic component can furthermore have a connection strip 12, which can be arranged on the connection carrier 2 and via which the radiation-emitting semiconductor chips of the component 1 can be electrically contact-connected and to which, for example, a sensor 11 with a driving device arranged outside the component can also be connected.

FIGS. 2B and 2C schematically show a plan view and a side view, respectively, of the optoelectronic component illustrated in perspective fashion in conjunction with FIG. 2A.

Figure 3:
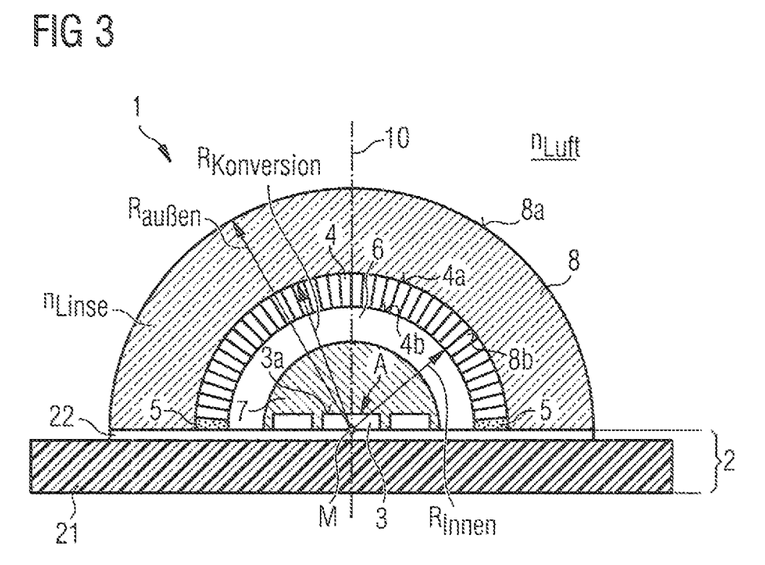

A further example of an optoelectronic component 1 described here is explained in greater detail in conjunction with the schematic sectional illustration in FIG. 3. In this example of the component, semiconductor chips and an optical sensor can be used, as explained in greater detail, for example, in conjunction with FIGS. 1 and 2.

The optoelectronic component comprises a connection carrier 2. In this case, the connection carrier 2 is a printed circuit board. The connection carrier 2 comprises a base body 21, which can be formed from an electrically insulating material such as a ceramic material or a plastics material. Furthermore, it is possible for the base body 21 to be a metal-core circuit board.

A reflective layer 22 is applied to the top side of the connection carrier. The reflective layer 22 forms a reflective coating of the connection carrier 2. By way of example, the reflective layer is formed from a reflective metal such as gold, silver or aluminum. Furthermore, it is possible for the reflective layer 22 to be a Bragg mirror.

The semiconductor chips 3 are applied to the connection carrier 2. The radiation-emitting semiconductor chips 3 are light-emitting diode chips. The radiation-emitting semiconductor chips 3 are fixed and electrically connected on the connection carrier 2.

The radiation-emitting semiconductor chips 3 are enveloped by a molded body 7. In the present case, the molded body 7 consists of silicone. The molded body 7 is embodied in the manner of a hemisphere, for example. The radiation-emitting semiconductor chips 3 are enveloped by the molded body 7 in a positively locking manner at their outer surfaces not facing the connection carrier 2. The molded body 7 is free of a luminescence conversion substance.

The molded body 7 is arranged within a hemispherical surface having the radius $R_{inner}$. In this case, the radius $R_{inner}$ is chosen such that the area content of the total radiation exit surface 33a of the radiation-emitting semiconductor chip lies between $1/20 \times \pi \times R_{inner}^2$ and $1/2 \times \pi \times R_{inner}^2$. In this way, the probability that, for example, electromagnetic radiation reflected back or emitted by the conversion element 4 does not impinge on the relatively poorly reflective radiation exit surfaces 3a of the radiation-emitting semiconductor chips 3, but rather on the reflective coating 22, from which it can be emitted again in the direction of the surroundings of the optoelectronic component 1, is reduced.

An interspace 6 is arranged between the molded body 7 and the conversion element 4. The interspace 6 is filled with air. In the example in FIG. 1, the interspace 6 directly adjoins the molded body 7 and the conversion element 4. The interspace 6 serves, inter alia, as a buffer for the case where the molded body 7 expands on account of heating during the operation of the radiation-emitting semiconductor chips 3. On account of the interspace 6 it is ensured in the optoelectronic component 1 that the molded body 7 does not press against the conversion element 4, which might lead, for example, to the detachment of the conversion element 4 from the connection carrier 2 and, hence, to a worsened thermal conductivity from the conversion element 4 to the connection carrier 2.

The conversion element 4 spans the radiation-emitting semiconductor chips 3 in a dome-like manner. The conversion element 4 is in the manner of a hemispherical shell. The conversion element 4 comprises an outer surface 4a and an inner surface 4b, which faces the semiconductor chip 3. It consists of a ceramic, for example, YAG:Ce or a sintered glass ceramic, wherein a ceramic luminescence conversion substance is introduced into a glass. In this case, the conversion element 4 is in a self-supporting fashion, that is to say that the conversion element 4 is a mechanically load-bearing structure which requires no further support elements to maintain the dome-like form. The conversion element 4 is fixed on the connection carrier 2. In this case, the conversion element 4 is fixed to the connection carrier 2 by means of an adhesive layer composed of an adhesive 5, which directly adjoins the connection carrier and the conversion element.

The adhesive 5 is preferably an adhesive formed with epoxy resin and/or silicone. In this case, the adhesive 5 can consist of one of the materials mentioned or contain one of the materials mentioned.

By way of example, it is also possible for one of the materials mentioned to form a matrix material of the adhesive 5, which contains metallic particles such as, for example, particles composed of silver, gold or nickel. An adhesive 5 of this type is then distinguished by an increased thermal conductivity.

Preferably, the conversion element 4 is fixed to the connection carrier 2 by a thin adhesive layer composed of the adhesive 5. In this case, the adhesive layer has a—within the scope of the production tolerance—uniform thickness. The thickness of the adhesive layer composed of the adhesive 5 is preferably between 1 µm and 10 µm, particularly preferably between 4 µm and 6 µm, for example, 5 µm.

Such a thin adhesive layer composed of the adhesive 5 contributes to the improved dissipation of heat from the conversion element 4 to the connection carrier 2.

During the operation of the radiation-emitting semiconductor chips, electromagnetic radiation is emitted in the direction of the conversion element 4. The conversion element 4 contains or consists of a luminescence conversion substance that converts part of the radiation into electromagnetic radiation having a different wavelength or in a different wavelength range. In the process, heat arises, which is emitted from the conversion element 4 to the connection carrier 2. In this case, the conversion element 4 is distinguished, inter alia, by its high thermal conductivity of at least 1.0 W/mK.

The conversion element 4 is succeeded by an outer coupling lens 8 as seen from the radiation-emitting semiconductor chips in the outer direction. The coupling-out lens 8 can be formed from glass or a plastics material such as, for example, silicone, epoxide or epoxide-silicone hybrid material. The coupling-out lens 8 is transparent at least to radiation in the visible spectral range and, in particular, free of a luminescence conversion substance.

The coupling-out lens 8 has a hemispherical inner surface 8b having a radius $R_{conversion}$. Furthermore, the coupling-out lens 8 has an outer surface 8a formed by a hemispherical surface having the radius $R_{outer}$. In this case, all the radii are formed from the point M formed by the point of intersection of the central axis 10 with the mounting surface of the connection carrier 2. In this case, the central axis 10 is preferably the central axis through the radiation exit surface 3a of the centrally arranged radiation-emitting semiconductor chips 3, which—within the scope of the production tolerance—is perpendicular to epitaxially grown layers of the radiation-emitting semiconductor chip 3. In this case, the radii for the inner surface 8b and the outer surface 8a of the coupling-out lens 8 follow the following condition: $R_{outer} \geq R_{conversion} * n_{lens}/n_{air}$, where $n_{lens}$ is the refractive index of the coupling-out lens 8 and $n_{air}$ is the refractive index of the surroundings of the coupling-out lens.

If this condition is met, then for electromagnetic radiation generated by the radiation-emitting semiconductor chips during operation, for radiation reemitted by the conversion element and for radiation reflected by the reflective layer 22, the condition for total reflection at the outer surface 8a of the coupling-out lens 8 is not met.

This optical concept is also explained for a different type of optoelectronic component in DE 102007049799.9, the disclosure and contents of which are hereby incorporated by reference.

Figure 4:
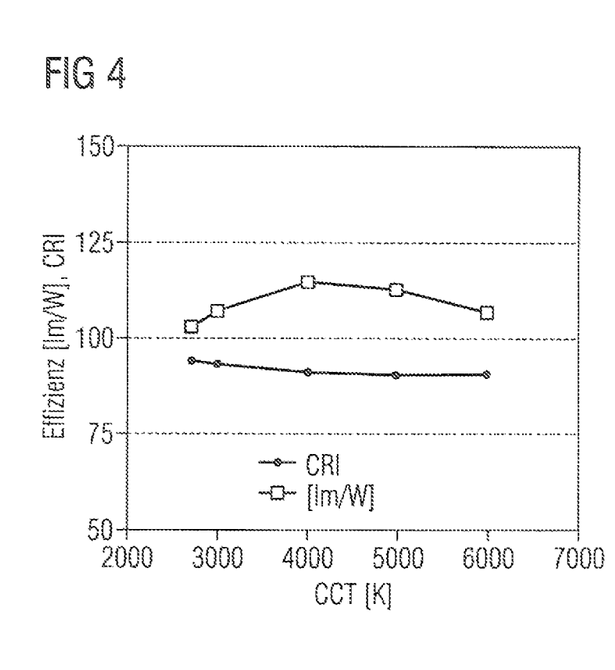
FIGS. 4 and 5 show, on the basis of schematic plots, further properties of optoelectronic components.

In conjunction with the schematic plot in FIG. 4 it is shown that, by means of an optoelectronic component 1 described here, it is possible to specify a light source which can generate white light having a correlated color temperature (CCT) in a range of between 2700 K and 6000 K with high efficiency and a relatively high color rendering index (CRI). In this case, the efficiency is above 100 lm/W for all color temperatures, and the color rendering index is greater than 90. In this case, blue radiation-emitting semiconductor chips 3b and semiconductor chips 3g which emit white light are used below the conversion element 4.

A warm-white light source at a color temperature of 3000 K is described in conjunction with FIG. 5, the light source having, in addition to a high color rendering index CRI of greater than 90, an improved color rendering index R9 for the representation of red light. For this purpose, the optoelectronic component contains at least one semiconductor chip which emits deep red light with a total radiation exit surface area of 1 mm². Furthermore, the optoelectronic component contains at least one semiconductor chip 3b which emits blue light with a total radiation exit surface area of 4 mm². Furthermore, the optoelectronic component contains at least one semiconductor chip 3r which emits red light with a total radiation exit surface area of 2 mm².

Figure 5A:
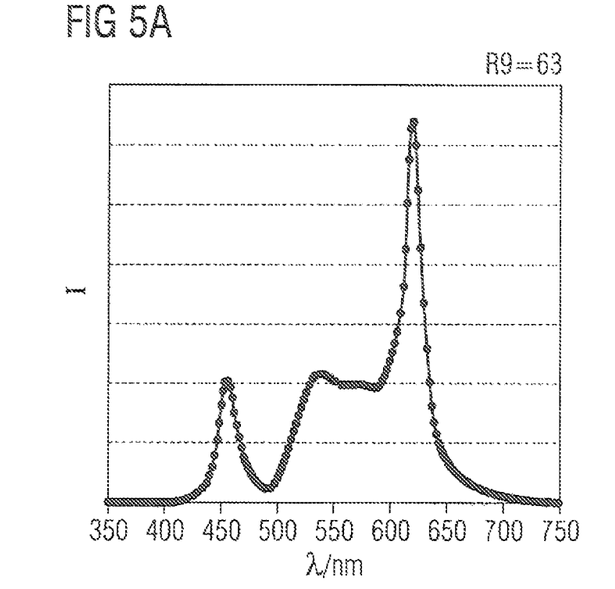
Figure 5B:
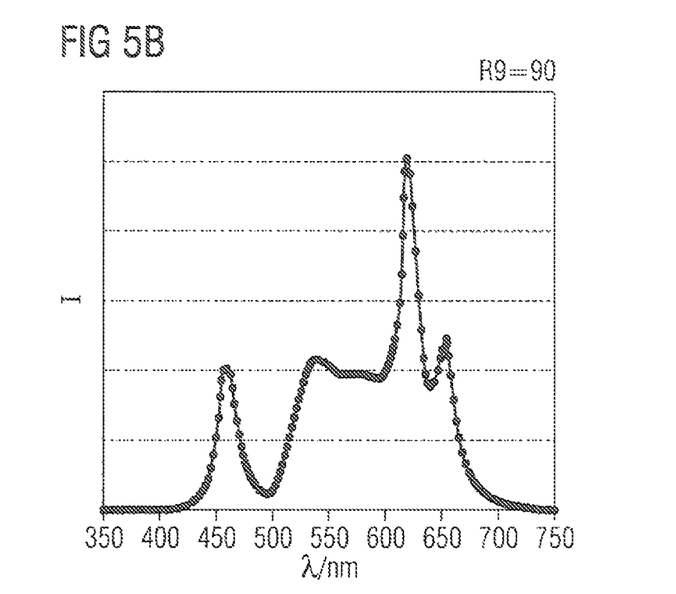
Figure 5C:
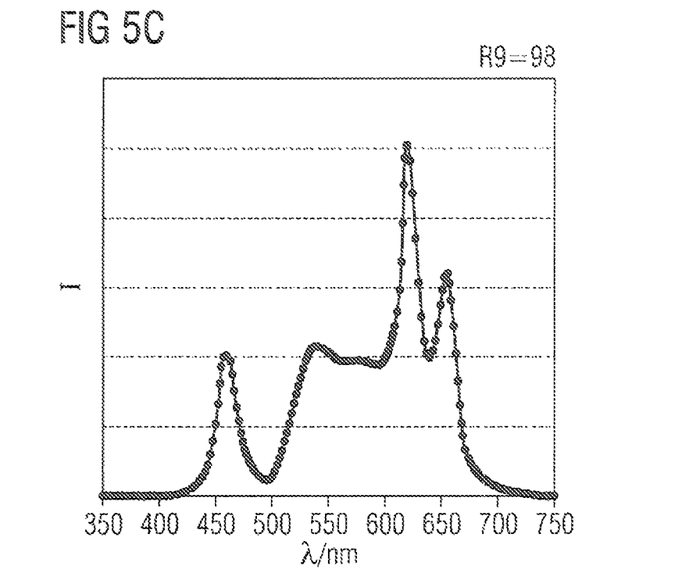
Figure 5D:
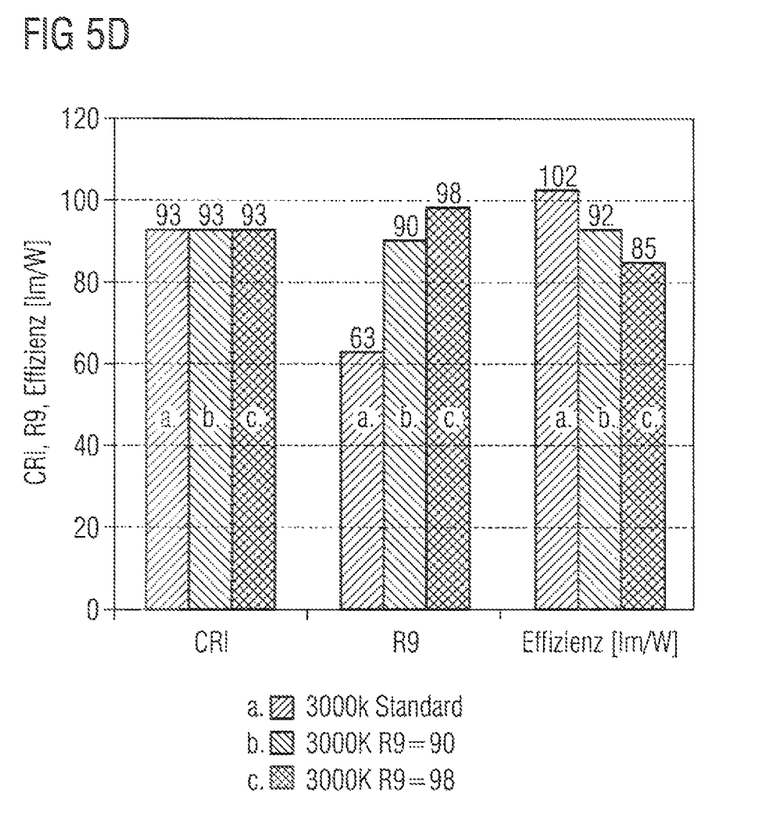

FIGS. 5A to 5C show, on the basis of schematic illustrations, the spectra of light sources described here for values of R9=63, 90 and 98. FIG. 5D shows, on the basis of bar charts, the color rendering index CRI, the color rendering index R9 and also the efficiency in lm/W for these three light sources. In this case, it can be seen that the loss of efficiency for a value of R9=90 is only approximately 10%. For a value of R9=98, the loss of efficiency is only 16%.

This disclosure is not restricted to the examples by the description on the basis thereof. Rather, the disclosure encompasses any novel feature and also any combination of features, which in particular includes any combination of features in the appended claims, even if this feature or this combination itself is not explicitly specified in the claims or examples.

The invention claimed is:

1. An optoelectronic component comprising:
   a connection carrier on which at least two radiation-emitting semiconductor chips are arranged, and
   a conversion element fixed to the connection carrier, wherein
   the conversion element consists of a ceramic material, is a mechanically self-supporting dome, and spans the semiconductor chips as a dome, and spans the semiconductor chips such that the semiconductor chips are surrounded by the conversion element and the connection carrier,
   the at least two of the radiation-emitting semiconductor chips differ from one another with regard to wavelengths of electromagnetic radiation they emit during operation, and
   at least one of the radiation-emitting semiconductor chips comprises a further conversion element and emits electromagnetic radiation from a spectral range of white light during operation.

2. The optoelectronic component according to claim 1, wherein at least one intermediate region filled with gas is arranged between the semiconductor chips and the conversion element.

3. The optoelectronic component according to claim 1, wherein an adhesive connector is arranged between the conversion element and the connection carrier, said connector directly adjoining the conversion element and the connection carrier.

4. The optoelectronic component according to claim 1, wherein the conversion element consists of a ceramic material or a glass ceramic material.

5. The optoelectronic component according to claim 1, wherein at least one of the radiation-emitting semiconductor chips emits electromagnetic radiation from a spectral range of red light during operation.

6. The optoelectronic component according to claim 5, wherein the semiconductor chip which emits white light comprises a semiconductor body downstream of which is disposed, at a radiation exit area, a further conversion element which converts at least part of the electromagnetic radiation generated in the semiconductor body during operation into electromagnetic radiation from a spectral range of yellow light.

7. The optoelectronic component according to claim 1, wherein an optical sensor is fixed on the connection carrier, said optical sensor being spanned by the conversion element that the optical sensor is surrounded by the conversion element and the connection carrier, wherein the optical sensor is designed to detect, during operation, the electromagnetic radiation generated by the radiation-emitting semiconductor chips during operation.

8. The optoelectronic component according to claim 1, wherein the semiconductor chips are embedded into a molded body.

9. The optoelectronic component according to claim 8, wherein the intermediate region extends between the molded body and the conversion element. wherein the intermediate region directly adjoins the molded body.

10. The optoelectronic component according to any of the preceding claim 1, wherein a coupling-out lens adjoins the outer surface of the conversion element, said outer surface facing away from the semiconductor chips.

11. The optoelectronic component according to claim 10, wherein the coupling-out lens comprises:
- an inner surface which faces the semiconductor chips and is enclosed by an inner hemispherical surface having radius $R_{conversion}$, and
- an outer surface which faces away from the semiconductor chips and encloses an outer hemispherical surface having radius $R_{outer}$, wherein
  the radii $R_{conversion}$, and $R_{outer}$ meet the following condition: $R_{outer} \geq R_{conversion} * n_{lens}/n_{air}$, wherein $n_{lens}$ is the refractive index of the coupling-out lens.

12. The optoelectronic component according to claim 8, wherein
the molded body is enclosed, by a hemispherical surface having radius $R_{inner}$,
the semiconductor chips have a total radiation exit surface having area content A, and
the area content A and the radius $R_{inner}$ meet condition $A \leq 1/2 * Pi * R_{inner}^2$.

13. The optoelectronic component according to claim 12, wherein the area content A and the radius $R_{inner}$ meet the condition $A \geq 1/20 * Pi * R_{inner}^2$.

14. The optoelectronic component according to claim 1, wherein the conversion element contains a luminescence conversion substance or consists of a luminescence conversion substance based on at least one selected from the group consisting of materials: orthosilicate, thiogallates, sulfide, nitride, fluoride and garnet.

15. The optoelectronic component according to claim 1, wherein the conversion element contains a luminescence conversion substance or consists of a luminescence conversion substance which is activated with one dopant selected from the group consisting of $Eu3+$, $Mn2+$ and $Mn4+$.

16. The optoelectronic component according to claim 7, wherein the optical sensor is embedded into a molded body.

17. The optoelectronic component according to claim 1. Wherein the conversion element is a mechanically self-supporting dome.

18. The optoelectronic component according to claim 3, wherein the adhesive connector is applied in a thin layer having a thickness of at most 10 μm.

19. The optoelectronic component according to claim 1, wherein the conversion element comprises at least one phosphor or consists of an at least one phosphor which has a decay trim greater than 1 μs.

20. The optoelectronic component according to claim 1, wherein the at least one radiation-emitting semiconductor chip which emits white light during operation comprises a semiconductor body and the farther conversion element, wherein a conversion substance of the further conversion element is applied directly to a radiation exit surface of said semiconductor body.

21. The optoelectronic component according to claim 1, wherein the light emitted by the at least one radiation-emitting semiconductor chip which emits light during operation is converted twice including a conversion from blue light into yellow light.

22. The optoelectronic component according to claim 1, wherein the conversion element comprises a conversion substance which is more temperature sensitive than a conversion substance of the further conversion element.

* * * * *

UNITED STATES PATENT AND TRADEMARK OFFICE
CERTIFICATE OF CORRECTION

PATENT NO. : 8,558,259 B2  
APPLICATION NO. : 13/128706  
DATED : October 15, 2013  
INVENTOR(S) : Wirth Page 1 of 1

It is certified that error appears in the above-identified patent and that said Letters Patent is hereby corrected as shown below:

In the Claims:

<u>In Column 15</u>

Claim 9, line 19, please delete "," after "element";

Claim 11, line 33, please delete "," after "radii $R_{conversion}$";

Claim 11, line 35, please insert the following text after "lens" -- and $n_{air}$ is the refractive index of the surroundings of the coupling-out lens --; and

Claim 12, line 38, please delete "," after "enclosed".

<u>In Column 16</u>

Claim 17, line 17 and 18, should read "claim 1, wherein."; and

Claim 20, line 30, please change "farther" to -- further --.

Signed and Sealed this  
Thirty-first Day of December, 2013

Margaret A. Focarino  
*Commissioner for Patents of the United States Patent and Trademark Office*